(12) United States Patent
Byun

(10) Patent No.: US 7,479,303 B2
(45) Date of Patent: Jan. 20, 2009

(54) METHOD FOR CHEMICAL VAPOR DEPOSITION (CVD) WITH SHOWERHEAD AND METHOD THEREOF

(75) Inventor: Chul Soo Byun, Seoul (KR)

(73) Assignee: Piezonica Co., Ltd., Ibjang-Myon, Cheonan-Si, Chungnam (KR)

( * ) Notice: Subject to any disclaimer, the term of this patent is extended or adjusted under 35 U.S.C. 154(b) by 128 days.

(21) Appl. No.: 11/436,727

(22) Filed: May 17, 2006

(65) Prior Publication Data

US 2006/0263522 A1    Nov. 23, 2006

(30) Foreign Application Priority Data

May 19, 2005    (KR) ............................ 2005-41910
Mar. 27, 2006   (KR) ............................ 2006-27444

(51) Int. Cl.
*C23C 16/00* (2006.01)

(52) U.S. Cl. .................. 427/248.1; 427/255.23; 118/715

(58) Field of Classification Search .......... 427/248.1, 427/255.28, 255.23; 118/715
See application file for complete search history.

(56) References Cited

U.S. PATENT DOCUMENTS

| | | | | |
|---|---|---|---|---|
| 5,556,476 A | * | 9/1996 | Lei et al. ................. | 118/728 |
| 6,143,082 A | * | 11/2000 | McInerney et al. ........ | 118/719 |
| 6,221,166 B1 | * | 4/2001 | Nguyen et al. .............. | 118/725 |
| 6,478,872 B1 | * | 11/2002 | Chae et al. ................. | 117/88 |
| 7,156,921 B2 | * | 1/2007 | Byun ........................... | 118/715 |
| 7,229,666 B2 | * | 6/2007 | Mardian et al. ............ | 427/248.1 |
| 2003/0077388 A1 | * | 4/2003 | Byun .......................... | 427/255.28 |
| 2003/0097987 A1 | * | 5/2003 | Fukuda ...................... | 118/723 E |

OTHER PUBLICATIONS

Tripathi, Sanjay, et al., "Comparison of the Applications of Process Simulations and FMEA: Two Case Studies". IEEE/SEMI Advanced Semiconductor Manufacturing Conference, 1994, pp. 140-143.*

* cited by examiner

*Primary Examiner*—Bret Chen
(74) *Attorney, Agent, or Firm*—Sheridan Ross P.C.

(57) ABSTRACT

Disclosed is a method of chemical vapor deposition (CVD). The method provides for use of a showerhead through which a source material gas including a reactive gas of at least one kind and a purge gas is injected over a substrate located in a reaction chamber to deposit a film on the substrate. The showerhead has reactive gas outlets surrounded by purge gas outlets. The bottom surface of the showerhead is spaced apart from the substrate by a predetermined distance. Reactive gases of different kinds are injected into compartments formed inside the showerhead so that each compartment of the showerhead is filled with the reactive gas of only one kind, and a purge gas of the source material gas is supplied into another compartment formed inside the showerhead. The reactive gas and the purge gas are discharged through the reactive gas outlets and purge gas outlets. Preferably, there are more purge gas outlets than reactive gas outlets.

6 Claims, 10 Drawing Sheets

⎯⎯→ Flow of reactive gas
······▶ Flow of purge gas

⎯⎯→ Flow of reactive gas
······▶ Flow of purge gas

METHOD FOR CHEMICAL VAPOR DEPOSITION (CVD) WITH SHOWERHEAD AND METHOD THEREOF

CROSS REFERENCE TO RELATED APPLICATIONS

This application claims priority under 35 U.S.C. § 119 to Korean Patent Application Serial No. 2005-41910 filed May 19, 2005, and Korean Patent Application Serial No. 2006-27444 filed on Mar. 27, 2006, which are incorporated herein in their entirety by this reference.

BACKGROUND OF THE INVENTION

1. Field of the Invention

The present invention relates to an apparatus for chemical vapor deposition (CVD) that is one of effective means for forming a film on a semiconductor integrated circuit, a fine mechanical structure, or a tool which requires surface treatments, and more particularly, to an apparatus for chemical vapor deposition (CVD) with a showerhead and method thereof, that can prevent a undesired particle deposition on the showerhead which supplies reactive gases uniformly over a substrate to grow a uniform film on the substrate in thickness and composition. Here, the present invention is associated with U.S. Patent Laid-Open Publication No. 2003-6077388 ("Method And Apparatus For Chemical Vapor Deposition Capable Of Preventing Contamination And Enhancing Film Growth Rate" filed on Oct. 9, 2002), the entire contents of which are hereby incorporated by reference.

2. Background Art

In an apparatus for chemical vapor deposition (CVD), a reactive gas is introduced into a vacuum reaction chamber, passes through a showerhead, then reaches a susceptor or a substrate holder on which a substrate is located.

Therefore, the reactive gas causes chemical reaction on the substrate to form a desired film. As means to provide energy necessary to induce chemical reactions on the substrate, a method of simply heating the substrate or atomically exciting the reactive gas, such as making plasma, is widely used. After the reaction is finished, byproduct gases are removed from the reaction chamber by an exhaust system including a vacuum pump, passes through a purifying system, then discharged into the atmosphere. However, since it is very important to prevent undesired particle deposition on a wall of the reaction chamber or the showerhead during a deposition process, it is preferable that the reactive gases do not react each other in a gaseous state. Unfortunately, if reactive gases whose decomposition temperature are substantially lower than 200° C. like metal-organic compounds are mixed in the reaction chamber, the mixture may cause homogeneous reactions in the gas phase so as to generate contaminant particles, or cause heterogeneous reactions on a solid-state surface, such as the showerhead surface or the reaction chamber wall so as to deposit undesired particles. Particularly, it may happen that the reactive gas is sensitive to a specific material, for example, zirconium tert-butoxide ($Zr(OC_4H_9)_4$) is extremely sensitive to moisture so as to form zirconium hydroxide ($Zr(OH)_x$) which is a powder. The moisture could have been physically adsorbed on the inner side of the reaction chamber but it may be also generated over the substrates as a byproduct gas.

Such moisture reacts with $Zr(OC_4H_9)_4$ on the inner wall of the reaction chamber or the surface of the showerhead, depositing a zirconium hydroxides of white powder type on the surface thereof. Then, the deposited particles are flaked off into fine particles due to a repeated thermal expansion and contraction and/or a lattice parameter mismatch with the inner wall of the reaction chamber. As a result of this, the film formed on the substrate may be contaminated and the productivity may be lowered due to a shortened process management cycle time for removing the deposited particles.

When a highly integrated semiconductor is manufactured, contaminant particles may cause a pattern defect such as short or disconnection between lines, and a size of the contaminant particle influencing on yield is in proportion to the line width. Therefore, as the line size becomes smaller, that is, as the density of the integration is increased, the size of particle influencing on yield becomes also smaller, whereby the number of contaminant particles to be controlled in the reaction chamber is more seriously limited.

FIG. 1 is a brief sectional view of a reaction chamber of a conventional plate type plasma CVD apparatus using a simple showerhead having a large number of holes as described in U.S. Pat. No. 6,631,692. When the reaction chamber is maintained in a vacuum state by a vacuum pump (not shown), material gases, that is, reactive gases flowing from a material gas supply tank is controlled by a mass flow controller 8 at a preferable flow rate, and the material gas delivered into a showerhead 20 is supplied on a substrate through fine holes formed on the bottom surface of the showerhead after being mixed sufficiently. After a flow is stabilized, a radio frequency (RF) electric field is generated between the showerhead 20 connected to an RF power source 4 and a susceptor grounded to an earth 13, and then, the material gas is ionized and the plasma state occurs. Atoms of the ionized material gas shows a chemical reaction on a semiconductor substrate 9 located on the susceptor 30, which keeps temperature of the substrate higher than that of surroundings using a substrate heater 14 embedded in the reaction chamber, whereby a desirable film is formed on the substrate 9. As a material gas, the silicon source gases such as $SiH_4$, DM-DMOS$[(CH_3)_2Si(OCH_3)_2]$, and TEOS, fluorine source gases such as $C_2F_6$, oxidizing gases such as oxygen, and inert gases such as Ar and He can be used.

There may be no serious problem when one of the above raw materials is used solely, but in case when a specific material, for example, metal-organic compound of a low decomposition temperature, is used as the material gas, the material gas may cause chemical reaction inside the showerhead or generate contaminant particles by decomposing by itself, thereby contaminating the inside of the reaction chamber and the surface of the substrate.

FIG. 2 shows a schematic sectional view of a showerhead of a prior art, U.S. Pat. No. 6,626,998, that has a function to uniformly spray reactive gas, which is introduced into a reaction chamber, over a substrate through a plurality of outlets without gas mixing. When each reactive gas is supplied to first ring type individual channels 23 through a plurality of gas supply passages 17, the gases are diffused in the first individual channels 23, and then, transmitted to second ring type individual channels 27 through a plurality of transition passages 25 formed on the bottom of each channel. After diffusion of the reactive gases in the second channels 27, the gases are supplied over a substrate through a plurality of second gas transition passages 31 which are formed on the bottom of the second channels. The reactive gases cause chemical reaction on the substrate (not shown) placed on a susceptor keeping temperature of the substrate higher than that of surroundings so as to form a desired film on the substrate.

However, a reactive gas such as metal-organic compound gas which has a decomposition temperature of about 200° C. or below may cause heterogeneous surface reactions including a thermal decomposition on the bottom surface of the showerhead, and particularly, if the reactive gas is sensitive to a specific material like moisture, the reactive gas may form unwanted deposits on the bottom of the showerhead by combining with the moisture produced as a byproduct.

With regard to the contamination path described above, FIG. 3 shows that the reactive gas or byproduct gas may reversely diffuse toward the showerhead in case that there is not provided suitable suppressing means. In FIG. 3, a thin arrow indicates an average drift flow of the reactive gases, and a thick arrow indicates a reverse diffusion direction of the reactive gases or byproducts toward the showerhead. The byproducts generated over the substrate may be reversely diffused toward a zone 8 existing between the showerhead and the substrate, and the gases in the zone 8 may be also reversely diffused toward the showerhead. Therefore, even if the conventional showerhead device shown in FIG. 2 may prevent each reactive gas from being mixed inside the showerhead and generating particles, in case that there is not provided suitable suppressing means, undesired particles may be deposited on the bottom of the showerhead by thermal decompositions or other chemical reactions. And this problem is especially serious if the substrate temperature becomes higher.

A necessity to form various kinds of films using various kinds of reactive gases by CVD process has been increased. However, if the conventional showerhead device is used further, undesired particles may deposit on the bottom of the showerhead due to the unexpected properties of the reactive gases used, which may limit the wide application of the CVD process.

SUMMARY OF THE INVENTION

Accordingly, to solve the above disadvantages of the prior arts, it is an object of the present invention to provide an apparatus for chemical vapor deposition (CVD) with a showerhead and method thereof, which can independently deliver each reactive gas through the showerhead, thereby preventing the reactive gases from causing chemical reaction and generating unwanted particles inside the showerhead.

It is another object of the present invention to provide an apparatus for chemical vapor deposition (CVD) with a showerhead and method thereof, which allows the purge gas to be injected from the bottom surface of the showerhead and to form a concentric flow by surrounding the flow of the reactive gas which is simultaneously jetted from the bottom surface of the showerhead, thereby preventing diffusion of the reactive gas backwardly, and preventing unwanted particle deposition on the outlet and the bottom surface of the showerhead.

It is a further object of the present invention to provide an apparatus for chemical vapor deposition (CVD) with a showerhead and method thereof, applied to a reactive gas confining means which surrounds the substrate and touches the bottom of the reaction chamber at its one end, thereby preventing undesired particle deposition on the inner wall of the reaction chamber and enhancing film growth rates on the substrates by confining the reactive gas in the vicinity of the substrate.

To accomplish the above mentioned objects, in an aspect of the present invention, there is provided a method of chemical vapor deposition (CVD), which supplies a source material gas over a substrate through a showerhead to deposit a film on the substrate, comprising the steps of: disposing a showerhead in such a way that the bottom surface of the showerhead is spaced apart from the substrate by a predetermined distance; supplying a source material comprising a reactive gas of at least one kind and a purge gas into the showerhead, wherein reactive gases of different kinds are respectively supplied into compartments formed inside the showerhead in such a way that each compartment of the showerhead is filled with the reactive gas of only one kind, and a purge gas is supplied into another compartment formed inside the showerhead; and injecting the reactive gas and the purge gas respectively through a large number of reactive gas outlets and a large number of purge gas outlets formed on the bottom surface of the showerhead, the purge gas outlets being more in number than the reactive gas outlets.

In another aspect of the present invention, there is provided an apparatus for chemical vapor deposition (CVD) with a showerhead, which supplies a source material gas comprising a reactive gas of at least one kind and a purge gas over a substrate through the showerhead to deposit a film on the substrate, wherein the showerhead includes: a plurality of reactive gas showerhead modules of the same number as the kinds of reactive gases, each of the reactive gas showerhead module having an inner space separated from each other and a large number of reactive gas flow channels connected to the bottom surface thereof for injecting the reactive gas over the substrate; and a purge gas showerhead module mounted under the reactive gas showerhead modules, having a purge gas supply port for supplying a purge gas thereto, an inner space separated from inner spaces of the reactive gas showerhead modules for being filled with the purge gas only, a large number of inlets formed on the upper surface thereof for allowing a penetration of the said reactive gas flow channels through the inner space thereof with hermetic sealing at the joints thereof, and a large number of exits for reactive gas flow channels and a large number of exits for purge gas on the bottom surface thereof, each purge gas exit having a diameter smaller than that of the reactive gas flow channel exit, and wherein each reactive gas flow channel of each reactive gas showerhead module placed at upper positions passes through the inside of the other reactive gas showerhead modules placed at lower positions as well as the inside of the purge gas showerhead module.

In a further aspect of the present invention, there is provided an apparatus for chemical vapor deposition (CVD) with a showerhead, which supplies a source material gas comprising a reactive gas of at least one kind and a purge gas over a substrate through the showerhead to deposit a film on the substrate, wherein the showerhead includes: a reactive gas showerhead module, of which inner space is divided into a plurality of separated compartments to introduce different kinds of reactive gases separately and alternatively through a reactive gas supply port formed on each compartment, having a plurality of reactive gas delivering holes formed on a bottom surface of each compartment and reactive gas flow channels connected to every reactive gas delivering hole for supplying reactive gases over the substrate; and a purge gas showerhead module mounted under the reactive gas showerhead module, of which inner space is separated from the said reactive gas showerhead module and filled with the purge gas through a purge gas supply port formed therein, having a large number of inlets formed on the upper surface thereof for allowing a penetration of the said reactive gas flow channels through the inner space thereof with hermetic sealing at the joints thereof, having a large number of exits for the said reactive gas flow channels and a large number of exits for the said purge gas on the bottom surface thereof, and wherein each purge gas exit has a diameter smaller than that of the reactive gas flow channel exit.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

As described above each reactive gas passes through a showerhead independently in the present invention, thereby preventing mixing of the reactive gases inside the showerhead, and the backward diffusion of the reactive gas and byproducts toward the showerhead is suppressed by a simultaneous jetting of purge gas from the bottom of the showerhead, thereby preventing unwanted deposition of particles on outlets and bottom surfaces of the showerhead. Moreover, the present invention was applied to a "reactive gas confining means" claimed in U.S. Patent Laid-Open Publication No. 2003-0077388 ("Method And Apparatus For Chemical Vapor Deposition Capable Of Preventing Contamination And Enhancing Film Growth Rate" filed on Oct. 9, 2002), thereby enhancing film growth rates on substrates as well as preventing both of reaction chamber inner wall and showerhead itself from unwanted particle deposition.

The purge gas doesn't either dissolve or generate byproducts by itself. For example, the purge gas includes Ar, $N_2$, and He. In addition to this, $H_2$ or $O_2$ may be included as a purge gas too, since it does not dissolve or generate byproducts by itself but may participate in the deposition process as a reactant. The purge gas, having a relatively small molecular weight, diffuses instantly in the reaction chamber and is relatively little influenced by a force circulation done by the act of vacuum pumping, and does not cause deposition or surface reaction on the inner structure of the reaction chamber.

Meanwhile, the reactive gas is a source material of vapor phase that participates directly in forming the film by pyrolysis, combination, and etc.; a mixture of vapor phase containing a main source material and carrier gas for vaporizing or diluting the main source material; or a purely vaporized main source material without the aid of carrier gas. The main source material includes, for example, $Pb(C_2H_5)_4$ which is a source material of Pb, $Zr(OC_4H_9)_4$ which is a source material of Zr, and $Ti(OC_3H_7)_4$ which is a source material of Ti, which are metal-organic compounds for the deposition of PZT (Lead Zirconium-Titanate) films. The carrier gas includes, for example, Ar, $N_2$, He, $H_2$ etc. The reactive gas causes adsorption and surface reaction on all of the inner structure of the reaction chamber which includes substrates, the reaction chamber inner wall, and the showerhead.

Figure 1:
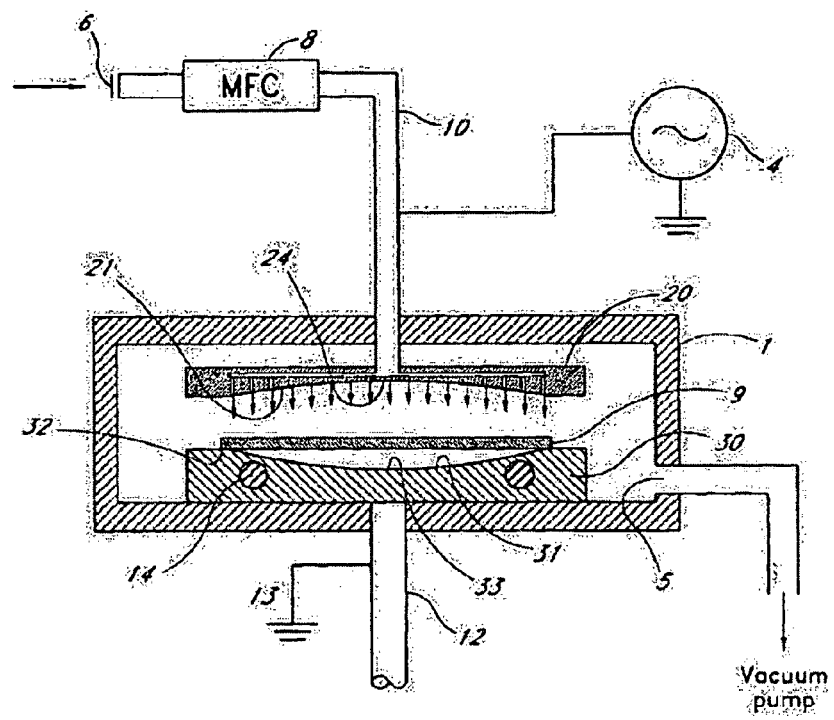
FIG. 1 is a brief sectional view showing a reaction chamber of a conventional plate type plasma CVD apparatus using a simple showerhead having a large number of exit holes.
Figure 2:
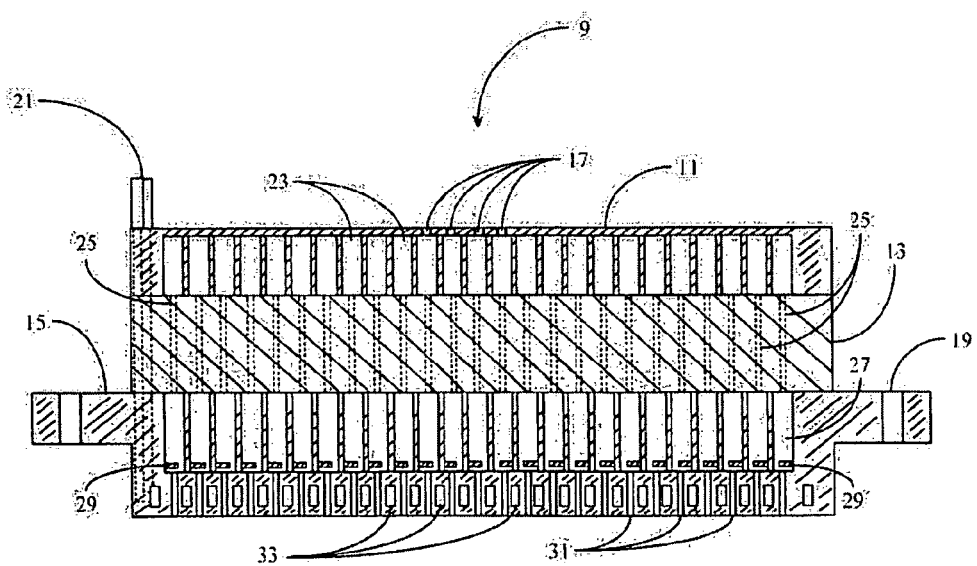
FIG. 2 is a brief sectional view showing a conventional showerhead for uniformly injecting reactive gases over a substrate through a large number of outlets without reactive gas mixing therein.
Figure 3:
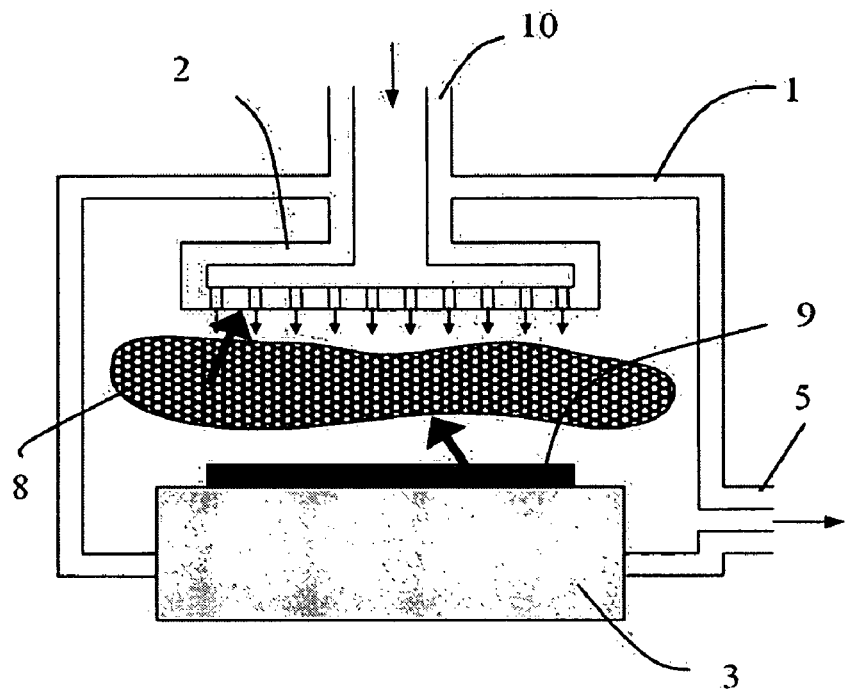
FIG. 3 is an exemplary view showing that the reactive gas or byproduct gas may reversely diffuse toward the showerhead in case that there is not provided suitable suppressing means.
Figure 4:
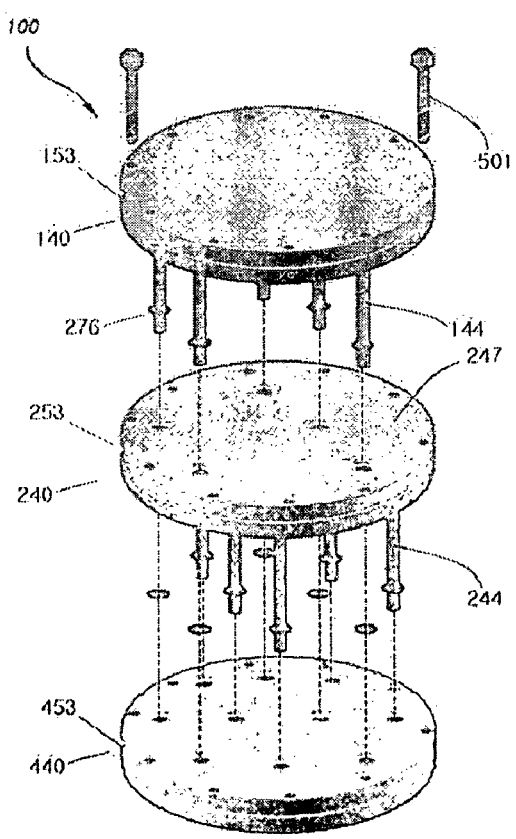
FIG. 4 is an exploded perspective view of a first embodiment according to the present invention including a plurality of reactive gas showerhead modules vertically laid on another and a purge gas showerhead module.
Figure 5:
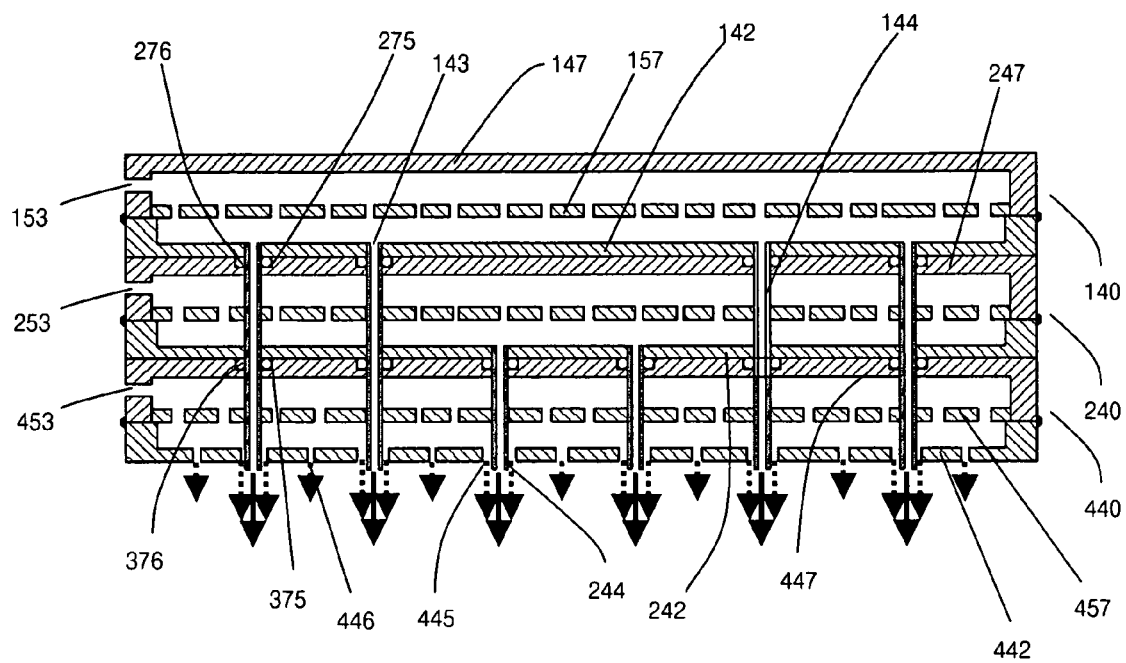
FIG. 5 is a sectional view of the first embodiment according to the present invention including a plurality of reactive gas showerhead modules vertically laid on another and a purge gas showerhead module.
Figure 6:
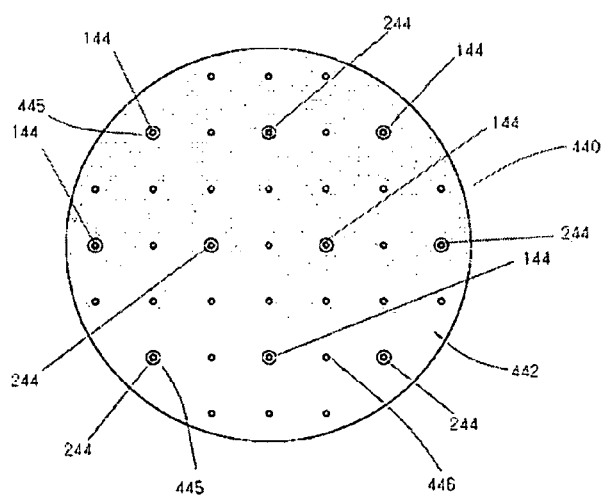
FIG. 6 is a bottom view seen from the bottom side of the purge gas showerhead module according to the first embodiment of a showerhead of the present invention.

FIGS. 4a to 4e show a first embodiment of a showerhead including a plurality of reactive gas showerhead modules and one purge gas showerhead module, wherein FIG. 4 is an exploded perspective view showing a state before assembly, and FIG. 5 is a sectional view of an assembled state, FIG. 6 is a bottom view of the showerhead. The showerhead 100 includes a plurality of the reactive gas showerhead modules 140 and 240 corresponding to the number of reactive gases, and one purge gas showerhead module 440. In the present invention, the reactive gas showerhead module means an assembly including at least one module for diffusing and delivering one of reactive gases. In the first embodiment of the present invention, reactive gases of two kinds are used.

One reactive gas is introduced into the upper reactive gas showerhead module 140 through an inlet 153 thereof, sufficiently diffused inside the reactive gas showerhead module 140 while passing through a diffusion plate 157 having a large number of fine holes, and then discharged from the reactive gas showerhead module 140 along a large number of holes 143 of the reactive gas showerhead module 140. Another reactive gas is introduced into the lower reactive gas showerhead module 240 through an inlet 253 thereof, and so on. A circular tube type reactive gas flow channel 144 is connected to each hole 143, and extends through the lower reactive gas showerhead module 240 located under the upper reactive gas showerhead module 140. The reactive gas flow channels 144 and 244 respectively extended from the reactive gas showerhead modules 140 and 240 finally pass through the upper surface 447 and the inside of the purge gas showerhead module 440. The purge gas is introduced into the purge gas showerhead module 440 through a purge gas inlet 453 thereof, sufficiently diffused inside the purge gas showerhead module 440 while passing through a diffusion plate 457 having a large number of fine holes, and then, reaches a purge gas showerhead module bottom 442.

Meanwhile, the purge gas showerhead module bottom 442 includes a large number of relatively large size exits 445 for surrounding end tips of reactive gas flow channels and a large number of relatively small size exits 446 for injecting purge gas only. The tube type gas flow channels 144 and 244 which pass through the upper surface 447 and penetrate the inside of the purge gas showerhead module 440 come to an end at the open ended area of the exits 445.

In this structure, the reactive gas is injected toward the substrate from the ends of the reactive gas flow channels 144 and 244 located at the central area of the reactive gas flow channel exit 445 of large size, and the purge gas is injected toward the substrate along an edge area of the reactive gas flow channel exit 445 of large size, namely, along a gap formed between the inner wall of the reactive gas flow channel exit 445 and the outer wall of the reactive gas flow channels 144 and 244 so that the purge gas is concentrically injected by surrounding the reactive gas. Here, the end tip of the reactive gas flow channels 144 and 244 are 0 to 3 mm indented or protruded from the end tip of the reactive gas flow channel exits 445 so as to effectively prevent contamination due to unwanted particle deposition on both of the reactive gas flow channels 144 and 244 and the reactive gas flow channel exit 445.

Meanwhile, only purge gas is injected toward the substrate through the purge gas exit 446 of small area. Owing to above operations of the purge gas, the prevention of unwanted particle deposition on the bottom surface of the purge gas showerhead module 440, reactive gas flow channel exit 445, and reactive gas flow channels 144 and 244 is accomplished. The total flow rate of the purge gas is externally controlled and would be several times as much as that of the reactive gas.

Figure 7:
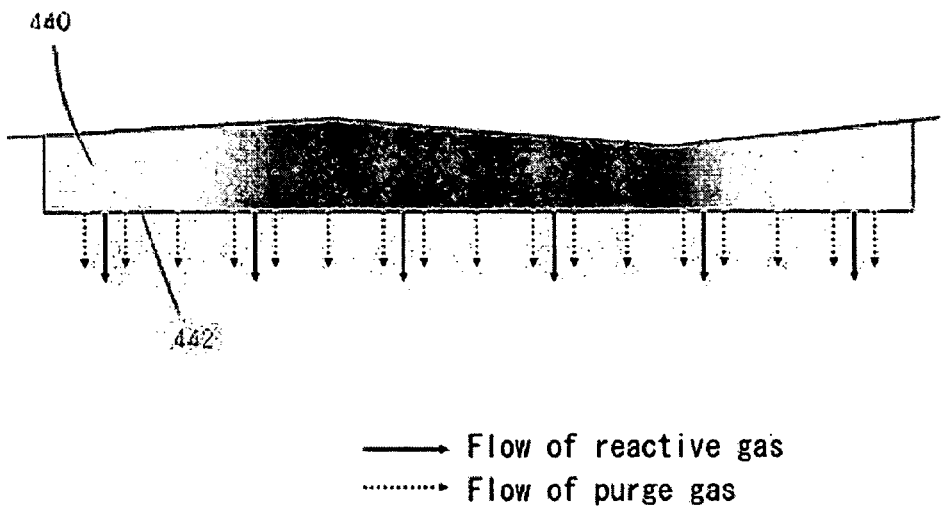
FIG. 7 is an exemplary view of the first embodiment of a showerhead according to the present invention, showing flow directions of a reactive gas and a purge gas injected from the showerhead.

FIG. 7 shows an injection pattern of the reactive gas and the purge gas near the bottom surface of the purge gas showerhead module. It is desirable that a flow rate of the purge gas injected through a reactive gas flow channel exit 445 is higher than that of the purge gas injected through a purge gas exit 446. It is desirable that the arrangement interval between the reactive gas flow channel exit 445 on the bottom surface of the purge gas showerhead module 440 is about 10 mm along both of the X and Y directions in the bottom surface, so that the number of the reactive gas flow channel exits 445 is about 250 for a 200 mm wafer and about 500 for a 300 mm wafer, and that a inner diameter of the reactive gas flow channel exit 445 is 3.5 mm to 5 mm.

Moreover, it is desirable that the purge gas exits 446 are arranged at proper intervals among the reactive gas flow channel exits 445, and the diameter of the purge gas exit is 0.8 mm~1.4 mm. However, the arrangement intervals and the number of the exits are not restricted to above values, but may be determined based on fabrication difficulties and required specifications such as uniformity.

Figure 8:
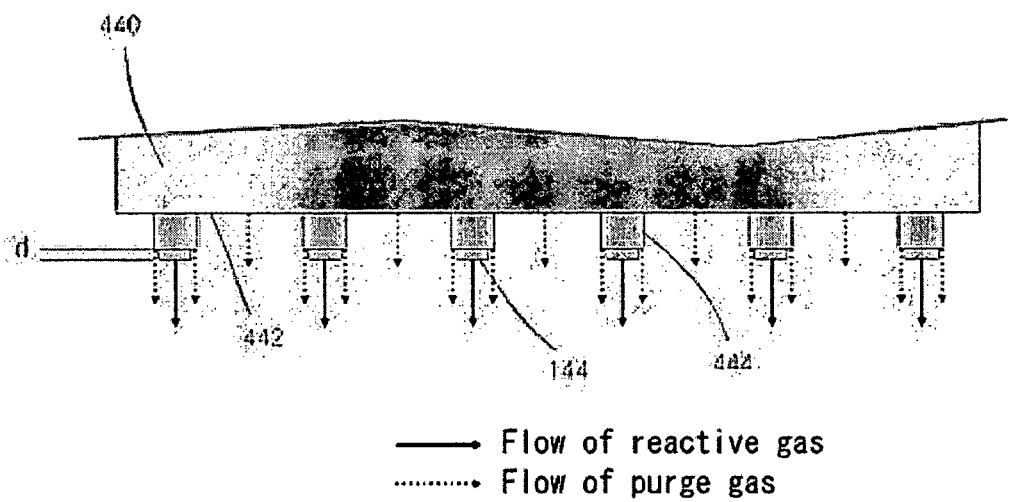
FIG. 8 is an exemplary view of the first embodiment of a showerhead according to the present invention, showing flow directions of a reactive gas and a purge gas injected from the showerhead where reactive gas flow channel exits are extended toward the substrate by a pre-determined length.

Meanwhile, as shown in FIG. 8, it is preferable that the reactive gas flow channel exit 445 is extended for a proper distance towards the substrate (not shown) by connecting a tube type exit extension 444 to the reactive gas flow channel exit 445. Concretely, if an end tip of the exit extension 444 is extended for 0~10 mm from the bottom surface of the purge gas showerhead module 440, it could be more effective in the prevention of contamination caused by unwanted particle deposition on the bottom surface of the purge gas showerhead module.

In the fabrication of the showerhead, it is preferable to join the reactive gas flow channels 144 to the holes 143 of the bottom surface 142 by laser welding. Additionally, O-ring 276 may be used to make a hermetic sealing between the reactive gas flow channel 144 and corresponding faces 142, 247, 242, or 447 of the showerhead module. Here, it is good that the O-ring groove 275 is prepared to have an inner diameter larger than the outer diameter of the O-ring 276 by 0.2 mm to 0.3 mm, and a depth smaller than the thickness of the O-ring by 0.6 to 0.9 mm.

In the assembling process for the present invention, the showerhead modules 140, 240, and 440 are tightened together by bolts 501. Then, a hermetic sealing between the reactive gas channels 144 and the upper surface of the lower reactive gas showerhead module 240 is done by the effect of pressed O-ring 276. Thereby, the inner spaces of showerhead modules 140, 240 and 440 are separated from each other.

The reactive gas supplied along the reactive gas flow channels 144 is not mixed with another reactive gas or the purge gas, until it is injected from the end tip of the reactive gas flow channel 144, then, mixed with another reactive gas and the purge gas at the space between the bottom surface 442 of the purge gas showerhead module 440 and the substrate (not shown).

Meanwhile, the exit extension 444 connected to the reactive gas flow channel exit 445 may not have an annular section but have a modified shape such as hollow polygon section. Then, the modified shape may be applied if such structure could maintain the concentric flow of the purge gas by surrounding the reactive gas flow. Therefore, as far as a slight modification to the present configuration provides a similar effect, the present invention is not restricted to the depicted configurations.

Meanwhile, to achieve the best uniformity in depositions, it is preferred that the bottom surface 442 of the purge gas showerhead module 440 and the substrate (not shown) be spaced apart from each other by a predetermined distance, and it is preferable that the distance is 70 mm~120 mm.

FIGS. 5a to 5f show the second embodiment of the present invention. In this embodiment the showerhead comprises two showerhead modules, that is, one reactive gas showerhead module 640 and one purge gas showerhead module 740. The reactive gas is distributed into a plurality of tube type reactive gas supply conduits (not shown) through distribution heads (not shown), the tube type reactive gas supply conduits are connected to a plurality of supply ports 655 disposed on the upper surface of the reactive gas showerhead module 640 in proper order.

Each supply port 655 is respectively connected to a compartment 656 which has a sliced cake shape in the reactive gas showerhead module. Each reactive gas is separately and alternately introduced into each compartment 656 which is hermetically sealed each other by a seal 658, then reaches the bottom surface of each compartment 656, through a diffusion plate 657 located inside each compartment 656. The bottom surface of each compartment 656 includes a plurality of holes 643 of the reactive gas showerhead module 640. Cylindrical tube type reactive gas flow channels 644 are connected to the holes 643, then pass through the upper surface 747 and penetrate the inside of the purge gas showerhead module 740. The purge gas is introduced into the purge gas showerhead module 740 through a purge gas inlet 753 of the purge gas showerhead module 740, sufficiently diffused inside the purge gas showerhead module 740 while passing through the diffusion plate 757 having a large number of fine holes, and then, reaches the bottom surface 742 of the purge gas showerhead module. The structure of the bottom surface 742 of the purge gas showerhead module, connection method and structure between the reactive gas flow channel 644 and the bottom surface 742 of the purge gas showerhead module, and effects of the showerhead are sufficiently described in the first embodiment of the present invention, and so, their repeated description will be omitted here.

Figure 9:
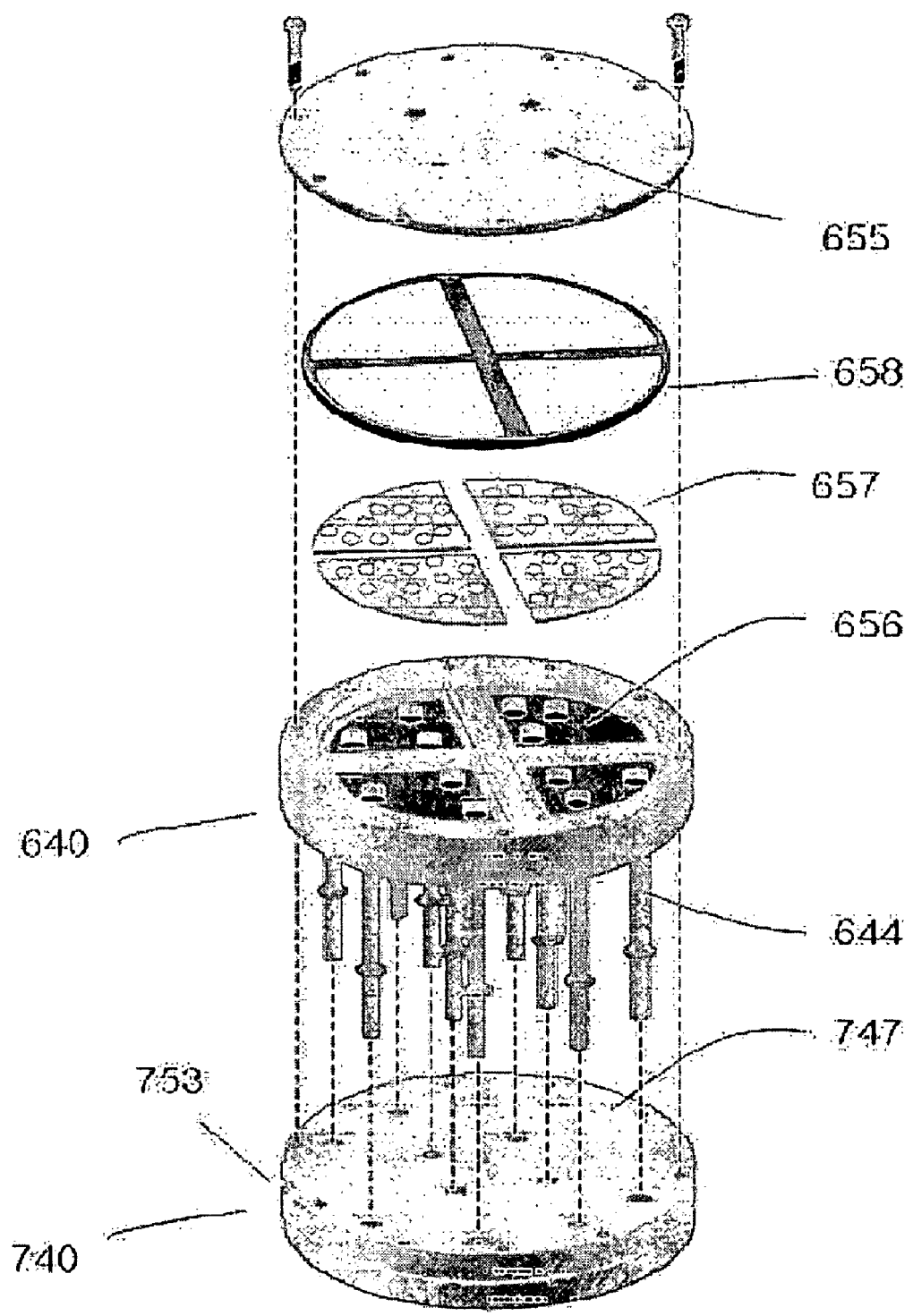
FIG. 9 is an exploded perspective view of a second embodiment of a showerhead according to the present invention including a reactive gas showerhead module with compartments divided by vertical partitions and a purge gas showerhead module.
Figure 10:
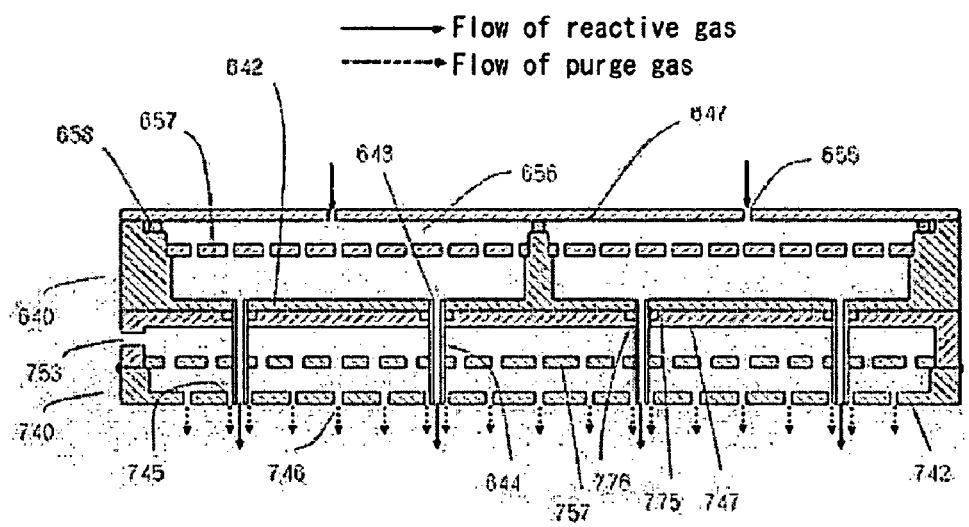
FIG. 10 is a sectional view of the second embodiment of a showerhead according to the present invention including a reactive gas showerhead module having compartments divided by vertical partitions and a purge gas showerhead module.
Figure 11:
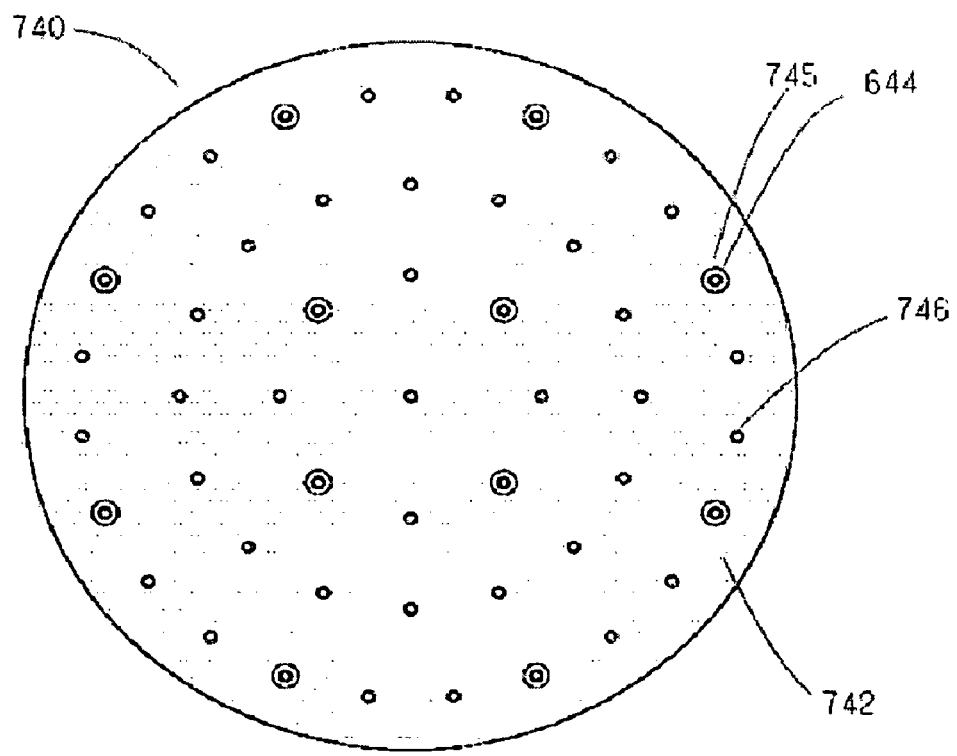
FIG. 11 is a bottom view seen from the bottom side of the purge gas showerhead module according to the second embodiment of the present invention.

In FIG. 9, the number of the compartments 656 disposed in the reactive gas showerhead module 640 is four. Of course, the number of the compartments 656 may be increased if necessary, but it is preferable that 24 compartments are arranged at an angle of 15 degrees. Here, if there are two kinds of reactive gases, the reactive gases are introduced into twelve compartments 656 in turn, but if there are three reactive gases, the reactive gases are introduced into eight compartments 656 in turn.

Figure 12:
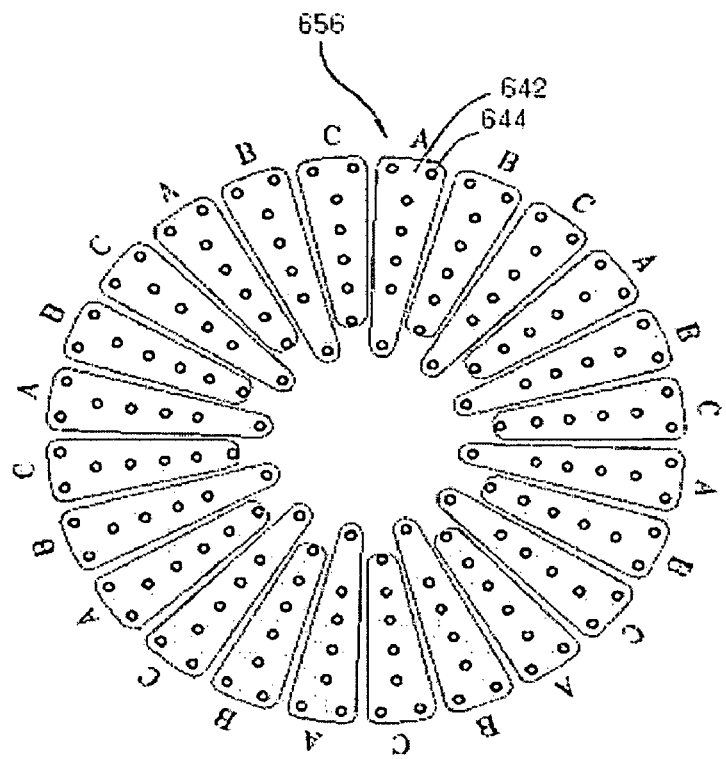
FIG. 12 is an exemplary view of compartments of a sliced cake shape according to the second embodiment of the present invention.

FIG. 12 shows sliced cake shape compartments 656. However, FIG. 13 shows modified sliced cake shape compartments 656 having a section gradually shifted in a circumferential direction, and conceptually shows that three kinds of reactive gases A, B and C are introduced into the reactive gas showerhead module 640 in turn.

Figure 13:
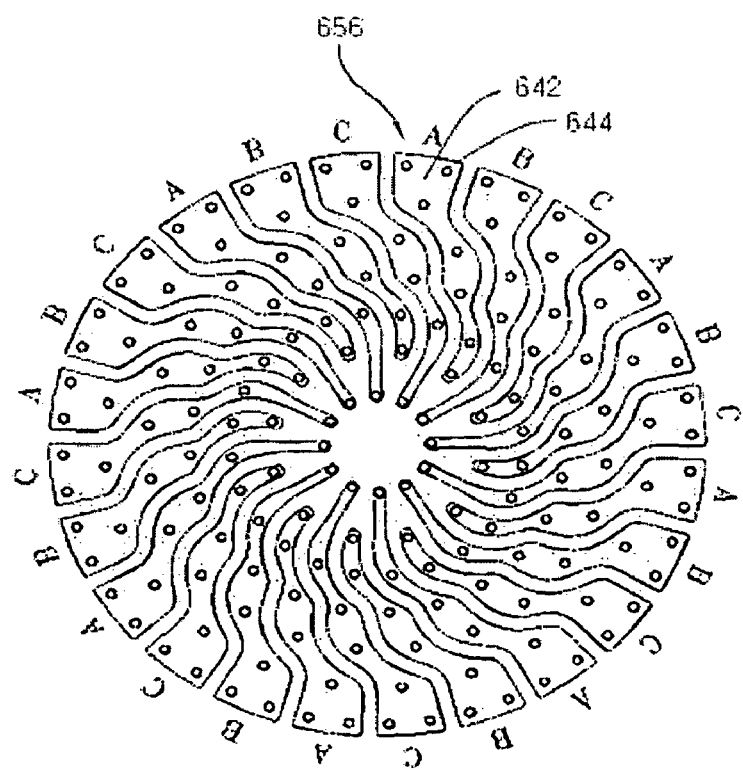
FIG. 13 is an exemplary view of compartments of a modified sliced cake shape according to the second embodiment of the present invention.

In FIG. 13 the arrangement of the reactive gas flow channel 644 does not have a specific direction such as radial direction, but is stepped and distorted circumferentially along the center of arrangement, so that the uniformity of the growing films would be enhanced in the circumferential direction.

Figure 14:
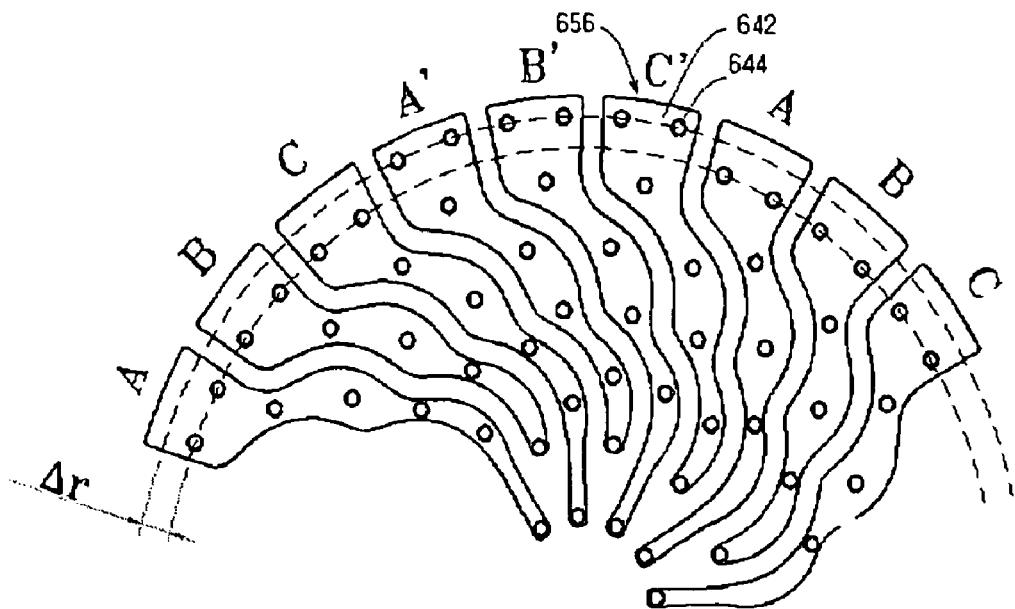
FIG. 14 is an exemplary view of compartments of a modified sliced cake shape in which locations of reactive gas flow channels are shifted by a predetermined distance along the radial direction according to the second embodiment of the present invention.

In the same way, as shown in FIG. 14, as the compartments 656 are repeatedly arranged along the circumferential direction (A and A', B and B', C and C'), locations of the reactive gas flow channels 644 formed on bottom of the compartments 656 are, compared to expected locations by repetition, offset by a predetermined distance ($\Delta r$ in FIG. 14) toward the radial direction, so that the uniformity of the growing films would be enhanced in the radial direction.

EXAMPLE 1

Figure 15:
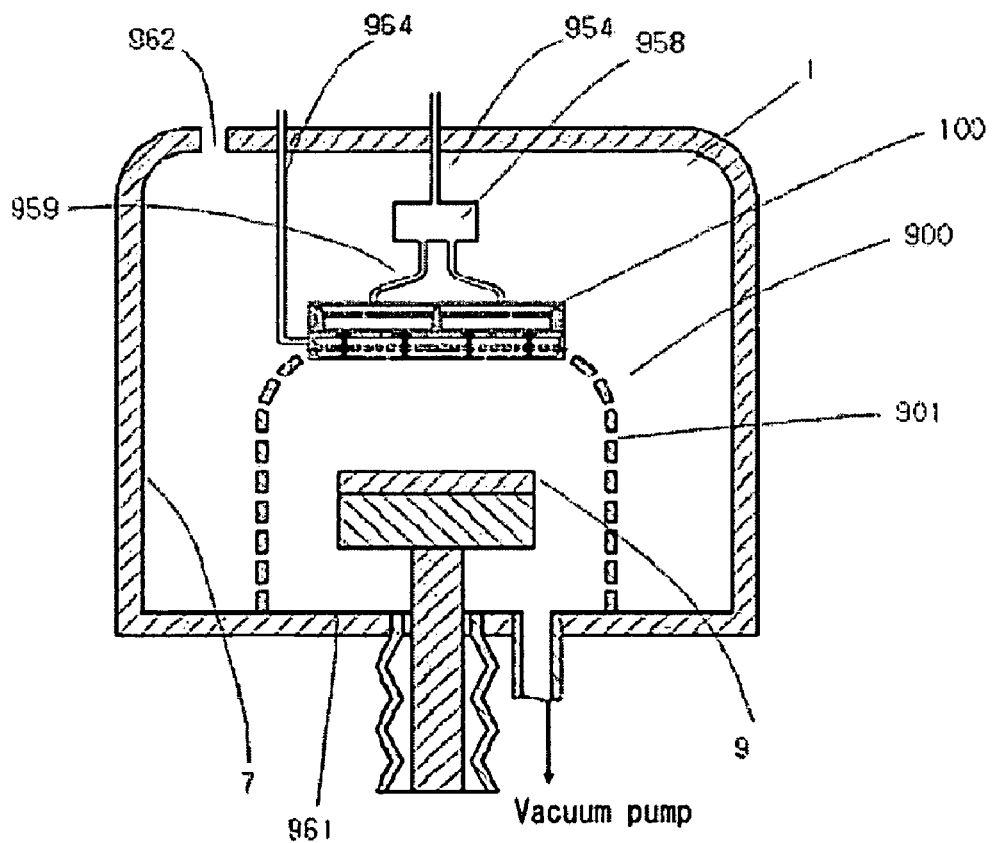
FIG. 15 is an exemplary view showing a configuration where the showerhead according to the present invention is applied to a reactive gas confining means.

FIG. 15 shows the first example where the showerhead 100 of the present invention is applied to a reactive gas confining means 900. Here, the reactive gas confining means 900 is spaced apart from the inner wall 7 and the ceiling of the reaction chamber 1 at a distance, surrounds the substrate 9 with a dome-like roof, touches the bottom 961 of the reaction chamber along its end, has a large number of fine holes formed thereon and an opening formed at the central portion of the roof thereof on which the rim of the showerhead 100 is placed along the opening so that the bottom surface of the showerhead 100 and the substrate are in parallel to and facing each other.

As shown in FIG. 15 of the first example, the reactive gas is introduced into the showerhead 100 through a reactive gas supply port 954, a distribution head 958, and a reactive gas supply conduit 959, and a first purge gas is introduced into the showerhead 100 through a first purge gas supply conduit 964. Then, the present invention accomplishes prevention of unwanted particle deposition on the surfaces of the showerhead. Meanwhile, a second purge gas is introduced to the outside of the reactive gas confining means 900 through a second purge gas supply port 962, then introduced to inside of the reactive gas confining means 900 through the second purge gas flow channels 901 formed across the reactive gas confining means 900, whereby such configuration can prevent unwanted particle deposition on the surface of the reactive gas confining means 900 and the inner wall 7 of the reaction chamber 1 as well.

Furthermore, in the first example, the reactive gas is confined in the vicinity of the substrate, that is, the reactive gas is highly concentrated at a region just over the substrate, so that a film growth rate is increased on the substrate. Moreover, compared to the conventional bubbler system or a liquid delivery system in which precursor delivery is done with the aid of carrier gas, the reactive gas may comprise only main source material gas such as purely vaporized source material without the aid of a carrier gas. For example, metal-organic compound at liquid phase, the source material in MOCVD (Metal Organic Chemical Vapor Deposition), may be converted to a pure vapor and be forced into the reaction chamber by being heated at temperatures of about 60-100□ if its equilibrium vapor pressure is high enough. In this case, as described in U.S. Patent Publication No. 2003-0077388, the enhancement effect of film growth rates on substrates becomes more distinct by the cooperation of the reactive gas comprising pure vapors and the second purge gas doing confinements.

Figure 16:
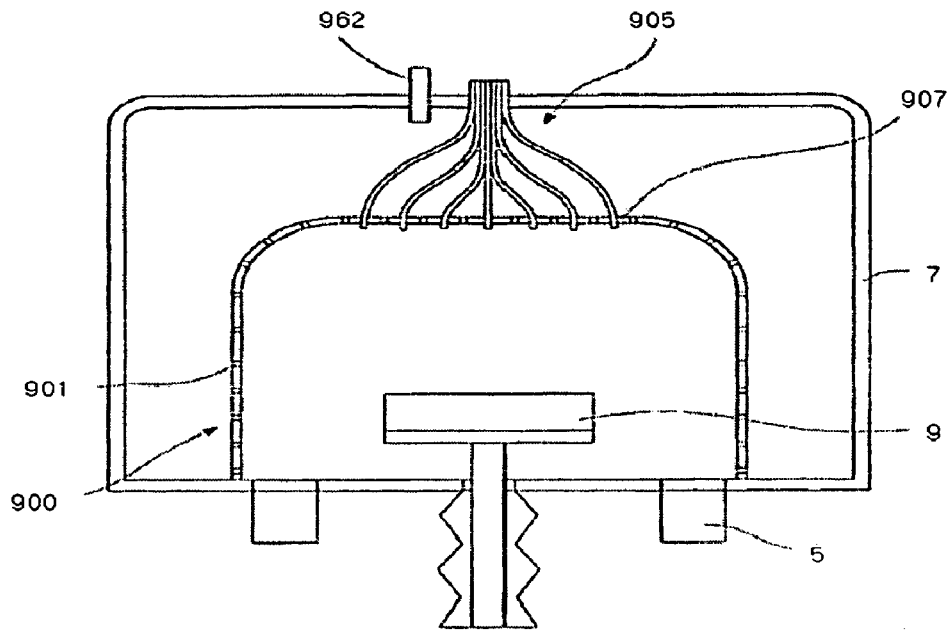
FIG. 16 is an exemplary view of the conventional CVD apparatus equipped with a reactive gas confining means on which the effect of the present invention does not exert.

FIG. 16 is an exemplary view showing a prior art CVD apparatus to which the present invention is not applied. In FIG. 16, outlets of a plurality of source material supply conduits 907 are formed inside the reactive gas confining means 900 as disclosed in U.S. Patent Publication No. 2003-0077388.

However, U.S. Patent Publication No. 2003-0077388 cannot propose a method for preventing contamination at areas of the end tips of the source material supply conduits 907. In this regards it is highly requested that the present invention be applied to the reactive gas confining means disclosed in U.S. Patent Publication No. 2003-0077388 to assure high film growth rates on substrates and to prevent contamination of reaction chamber internal structures including a reaction chamber inner wall and a showerhead.

EXAMPLE 2

Figure 17:
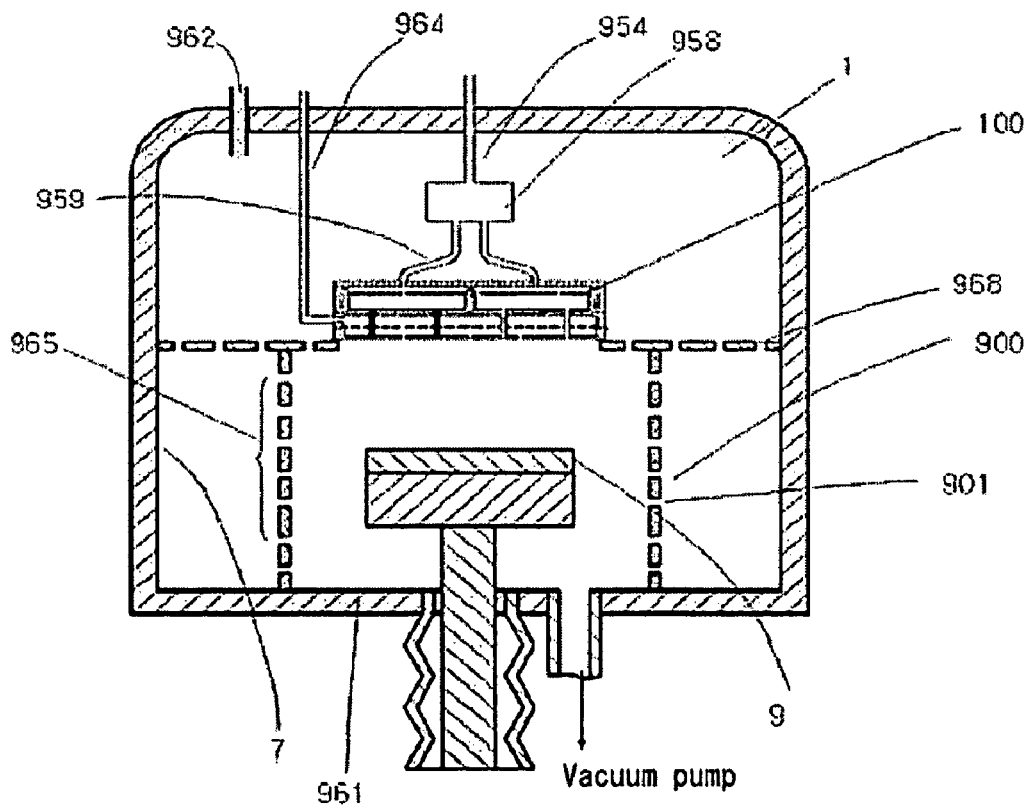
FIG. 17 is an exemplary view showing a configuration where the showerhead according to the present invention is applied to another reactive gas confining means.

FIG. 17 shows the second example where the showerhead 100 configured according to the present invention is applied to a reactive gas confining means 900. Here, the reactive gas confining means 900 is spaced apart from the inner wall 7 and the ceiling of the reaction chamber 1 at a distance, surrounds the substrate 9 in a cylindrical form with no roof, touches the bottom 961 of the reaction chamber at one its end thereof, has a large number of fine holes formed thereon. A disc 968 having a large opening at the center thereof is placed on the upper portion of the reactive gas confining means, so that the rim of the showerhead 100 is placed on the central portion of the disc 968 and the bottom surface of the showerhead 100 and the substrate are in parallel to and facing each other.

As shown in FIG. 17 of the second example, the second purge gas is introduced to the outside of the reactive gas confining means 900 through a purge gas supply port 962 connected to the reaction chamber 1 and perforated holes across disc 968, then, introduced to inside of the reactive gas confining means 900 through the second purge gas flow channels 901 formed across the surface of the reactive gas confining means 900. Functions and effects in this second example of the present invention are sufficiently described in the first example of the present invention, so that their repeated description will be omitted here.

EXAMPLE 3

Figure 18:
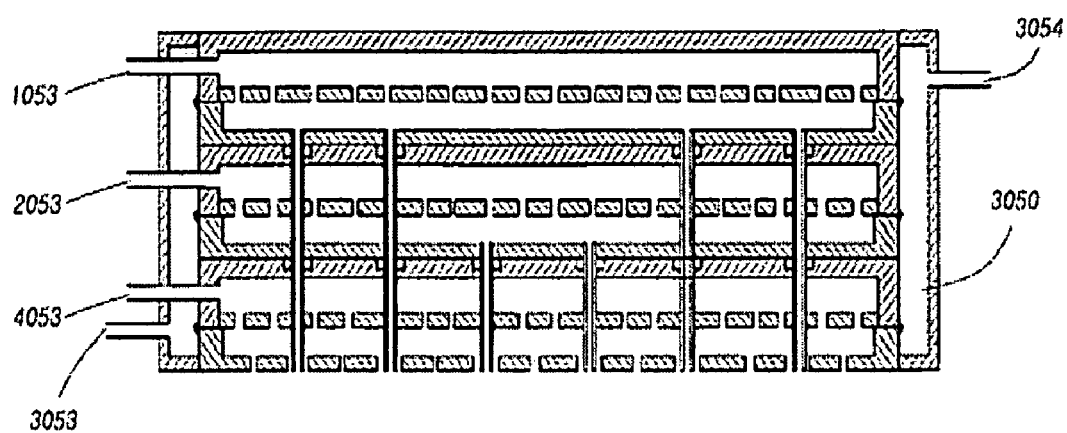
FIG. 18 is an exemplary view showing a configuration having a cylindrical cooling jacket surrounding the showerhead according to another embodiment of the present invention.

As shown in FIG. 18, a cooling jacket 3050 is mounted by surrounding the part of vertical wall of the showerhead. The cooling jacket 3050 has a function to keep temperature of the showerhead at steady state, for example, at temperature of 150° C.~200° C.

A refrigerant supplied into the cooling jacket 3050 through a refrigerant supply port 3054 of the cooling jacket 3050 cools the showerhead properly and finally goes out from the reaction chamber along a discharge channel (not shown) connected to a refrigerant outlet port 3053. Here, the refrigerant may be one of compressed air, cooling water, and so on, and it is very important to assure the prevention of a refrigerant leakage from the cooling jacket and the connected discharge channel to the reaction chamber. A thermocouple (not shown) may be mounted at any proper place of the surface of the showerhead to measure and control showerhead temperature. Since it may belong to a general method, detailed description will be omitted here. The cooling jacket technology in the present invention serves not only for enhancing reproducibility in film deposition process but also for preventing unwanted film deposition at the showerhead by thermal decomposition of the reactive gas caused by unnecessarily high temperature of the showerhead.

As described above the present invention has a function that each reactive gas passes through a showerhead independently, thereby preventing mixing of the reactive gases inside the showerhead.

Furthermore, the present invention has a function that the purge gas is injected from the bottom surface of the showerhead and forms a concentric flow by surrounding the flow of the reactive gas which is simultaneously jetted from the bottom surface of the showerhead, thereby preventing diffusion of the reactive gas backwardly, and preventing unwanted particle deposition on the outlet holes and the bottom surface of the showerhead.

Moreover, the present invention has a configuration that a cooling jacket is mounted around the wall of the showerhead wall, thereby maintaining temperature of the showerhead at steady state and preventing unwanted film deposition caused by thermal decomposition of the reactive gases.

Additionally if the present invention is applied to a CVD system together with a reactive gas confining means, unwanted particle deposition on the reaction chamber inner wall as well as on the showerhead is prevented and process managing cycle time to remove the particle is lengthened much.

In addition if the present invention is applied to a CVD system together with a reactive gas confining means, the reactive gas is confined in the vicinity of the substrate, thereby the film growth rate is increased compared to the process which does not use a reactive gas confining means.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of chemical vapor deposition (CVD) comprising:
   providing a showerhead through which a source material gas including a reactive gas of at least one kind and a purge gas is injected over a substrate located in a reaction chamber to deposit a film on the substrate, wherein the showerhead has a plurality of reactive gas outlets and each is surrounded by a corresponding purge gas outlet;
   disposing the showerhead in such a way that the bottom surface of the showerhead is spaced apart from the substrate by a predetermined distance;
   supplying a reactive gas of the source material gas into the showerhead, wherein reactive gases of different kinds are injected into compartments formed inside the showerhead so that each compartment of the showerhead is filled with the reactive gas of only one kind and a purge gas of the source material gas is supplied into another compartment formed inside the showerhead; and
   discharging the reactive gas and the purge gas through the plurality of reactive gas outlets and the plurality of purge gas outlets formed on the bottom surface of the showerhead wherein the reactive gas is discharged from the individual reactive gas outlets and the discharged reactive gas is surrounded by discharged purge gas, and further wherein the discharged reactive gas and purge gas are discharged in the same direction toward the substrate.

2. A method of chemical vapor deposition (CVD) according to claim 1, wherein in the discharge step, a flow of the reactive gas injected from the reactive gas outlets is surrounded by a flow of the purge gas injected from one part of the purge gas outlets which surround the reactive gas outlet, and the other part of the purge gas outlets which do not surround the reactive gas outlets discharge only the purge gas.

3. A method of chemical vapor deposition (CVD) according to claim 1, wherein the purge gas is at least one selected from the group consisting of Ar, $N_2$, He, $H_2$ and $O_2$.

4. A method of chemical vapor deposition (CVD) according to claim 1, wherein the reactive gas is a pure vapor by heating metal-organic compounds at liquid phase.

5. A method of chemical vapor deposition (CVD) according to claim 1, wherein the reactive gas is a mixture of a vaporized material containing compositions of the film deposited and a carrier gas for vaporizing said material in an evaporator.

6. A method of chemical vapor deposition (CVD) according to claim 1, further comprising the step of cooling the showerhead by supplying a refrigerant into a cooling jacket surrounding the showerhead, then discharging the refrigerant from the reaction chamber.

* * * * *